(12) United States Patent
Clark et al.

(10) Patent No.: US 6,509,851 B1
(45) Date of Patent: Jan. 21, 2003

(54) METHOD FOR USING A RECOVERED DATA-ENCODED CLOCK TO CONVERT HIGH-FREQUENCY SERIAL DATA TO LOWER FREQUENCY PARALLEL DATA

(75) Inventors: Leah S. Clark, San Diego, CA (US); Steven P. Larky, Del Mar, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/538,201

(22) Filed: Mar. 30, 2000

(51) Int. Cl.$^7$ ................................................ H03M 9/00
(52) U.S. Cl. .................... 341/100; 345/533; 365/233
(58) Field of Search .................. 365/233; 345/533, 345/521, 571; 341/100

(56) References Cited

U.S. PATENT DOCUMENTS

| | | | |
|---|---|---|---|
| 3,662,340 A | * 5/1972 | Spencer | 340/146.2 |
| 4,930,108 A | * 5/1990 | Sugiyama | 365/230.02 |
| 5,341,371 A | 8/1994 | Simpson | 370/85.4 |
| 5,362,249 A | 11/1994 | Carter | 439/357 |
| 5,535,208 A | 7/1996 | Kawakami et al. | 370/84 |
| 5,535,214 A | 7/1996 | Shiobara | 370/85.6 |
| 5,689,244 A | 11/1997 | Iijima et al. | 340/825.07 |
| 5,828,899 A | 10/1998 | Richard et al. | 335/828 |
| 5,848,240 A | 12/1998 | Yamamoto | 395/200.43 |
| 5,886,983 A | 3/1999 | Suters et al. | 370/235 |
| 5,933,159 A | * 8/1999 | Choi | 345/533 |
| 6,147,926 A | * 11/2000 | Park | 365/233 |

* cited by examiner

Primary Examiner—Peguy JeanPierre
Assistant Examiner—Jean Bruner JeanGlaude
(74) Attorney, Agent, or Firm—Christopher P. Maiorana, P.C.; Robert M. Miller

(57) ABSTRACT

An apparatus comprising an array of storage elements, a first circuit, and a second circuit. The array of storage elements may be configured to (i) store a first bit of data in response to a write address and a first edge of a first clock signal, (ii) store a second bit of data in response to the write address and a second edge of the first clock signal, and (iii) present one or more of the first and second bits in response to a read address. The first and second edges of the first clock generally have opposite polarities. The first circuit may be configured to generate the first clock signal in response to a serial data stream and a strobe signal. The second circuit may be configured to generate the write address and the read address in response to the first clock signal and a second clock signal.

20 Claims, 5 Drawing Sheets

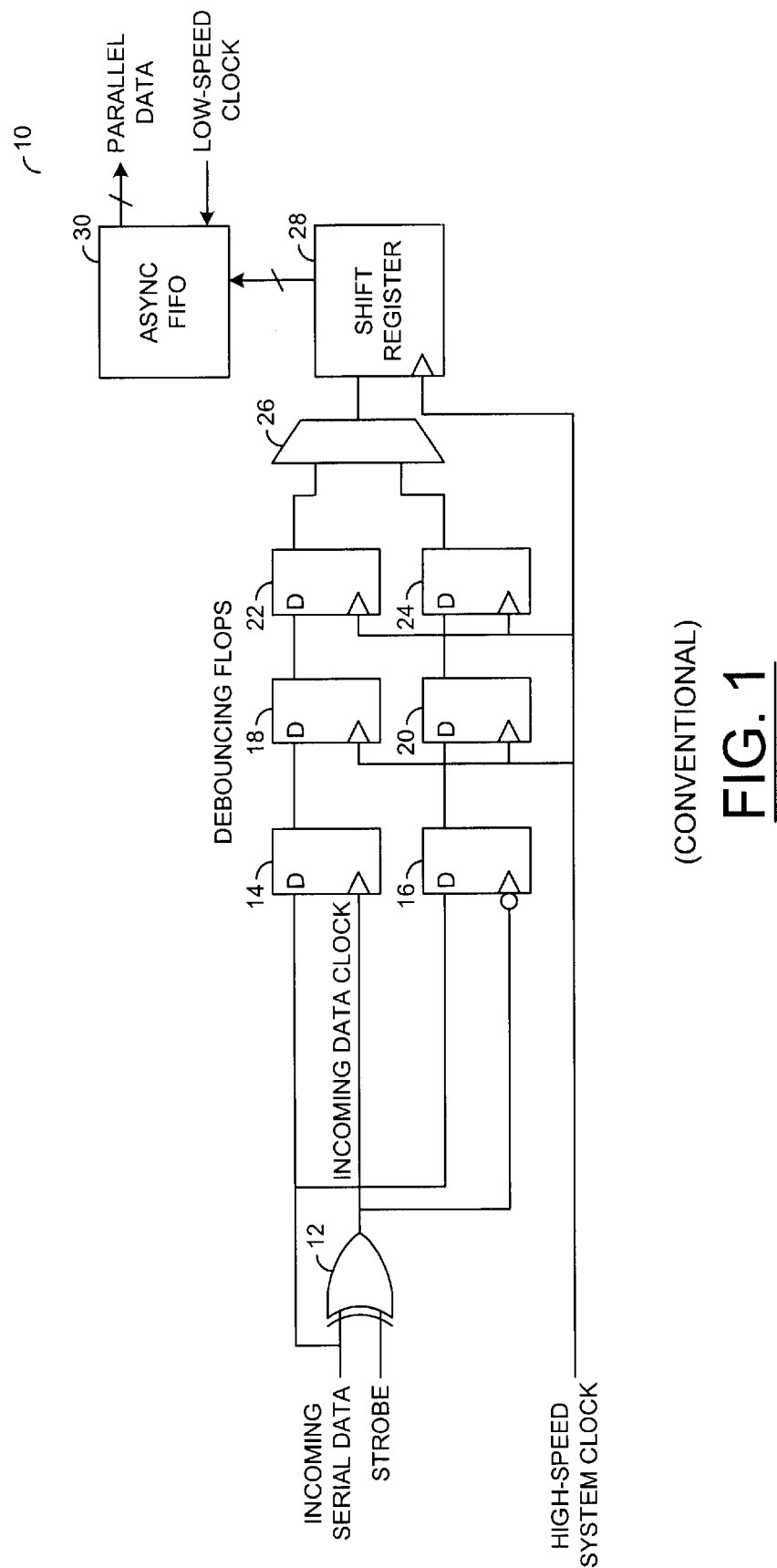
FIG. 1 (CONVENTIONAL)

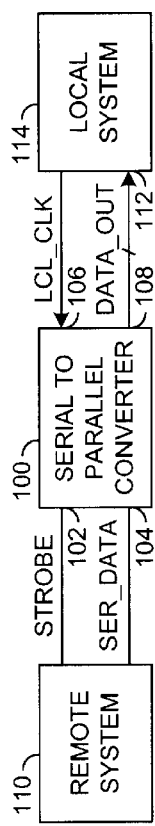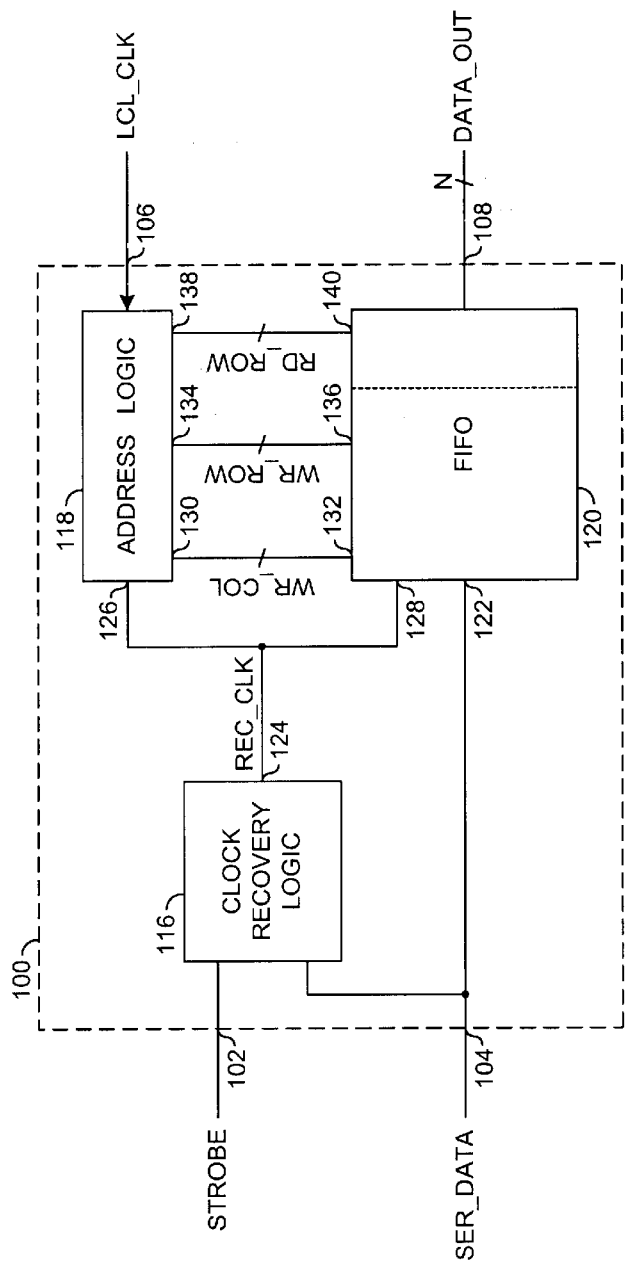

METHOD FOR USING A RECOVERED DATA-ENCODED CLOCK TO CONVERT HIGH-FREQUENCY SERIAL DATA TO LOWER FREQUENCY PARALLEL DATA

FIELD OF THE INVENTION

The present invention relates to a method and/or architecture for converting high-frequency serial data to lower frequency parallel data generally and, more particularly, to a method and/or architecture for using a recovered data-encoded clock to convert high-frequency serial data to lower frequency parallel data.

BACKGROUND OF THE INVENTION

Refering to FIG. 1, a circuit 10 illustrating a conventional serial to parallel converter is shown. The circuit 10 has an exclusive OR gate 12, a flip-flop 14, a flip-flop 16, a flip-flop 18, a flip-flop 20, a flip-flop 22, a flip-flop 24, a multiplexer 26, a shift register 28 and an asynchronous FIFO memory 30. The circuit 10 converts an incoming serial data stream into a parallel data stream in response to a strobe signal and a high-speed system clock signal.

The circuit 10 relies on the shift register 28 that is loaded serially to transfer parallel data into the FIFO storage block 30. The shift register 28 is continuously shifted in response to the high-speed system clock. The data in the shift register 28 is loaded into the FIFO 30 when a binary counter (not shown) reaches a predetermined word width (e.g., 2, 4 or 8).

The circuit 10 can mis-align data when the word width of the serial data stream is less than the FIFO width, or when there is an incomplete word at the end of the serial data stream. Incomplete words can occur regularly when dribble bits are sent (see IEEE 1394 standard).

The circuit 10 requires an external high-speed clock source. Synchronizing the high-speed clock with the data clock can require a complex clocking scheme.

SUMMARY OF THE INVENTION

The present invention concerns an apparatus comprising an array of storage elements, a first circuit, and a second circuit. The array of storage elements may be configured to (i) store a first bit of data in response to a write address and a first edge of a first clock signal, (ii) store a second bit of data in response to the write address and a second edge of the first clock signal, and (iii) present one or more of the first and second bits in response to a read address. The first and second edges of the first clock generally have opposite polarities. The first circuit may be configured to generate the first clock signal in response to a serial data stream and a strobe signal. The second circuit may be configured to generate the write address and the read address in response to the first clock signal and a second clock signal.

The objects, features and advantages of the present invention include providing a method and/or architecture for using a recovered data-encoded clock to convert high-frequency serial data to lower frequency parallel data that may: (i) maintain an order of the incoming data without realigning incomplete words externally to a storage device; (ii) implement gray codes to directly access the memory and transfer pointer information across clock domains; (iii) guarantee that data is always valid when clocked as the clock is generated directly from the data; (iv) eliminate the need for a complex clocking scheme and external high-speed clock source; (v) run completely on the recovered data clock, even though the recovered data clock is not continuous; (vi) automatically maintain proper order and alignment of incoming data regardless of width; (vii) automatically strip "dribble bits" from the end of the data stream if desired; and/or (viii) be synchronous and synthesizable, minimizing errors and reducing time-to-market.

BRIEF DESCRIPTION OF THE DRAWINGS

These and other objects, features and advantages of the present invention will be apparent from the following detailed description and the appended claims and drawings in which:

FIG. 1 is a block diagram illustrating a conventional circuit for converting high frequency serial data to lower frequency parallel data;

FIG. 2 is a block diagram illustrating a preferred embodiment of the present invention;

FIG. 3 is a detailed block diagram of a preferred embodiment;

DETAILED DESCRIPTION OF THE PREFERRED EMBODIMENTS

Figure 4:
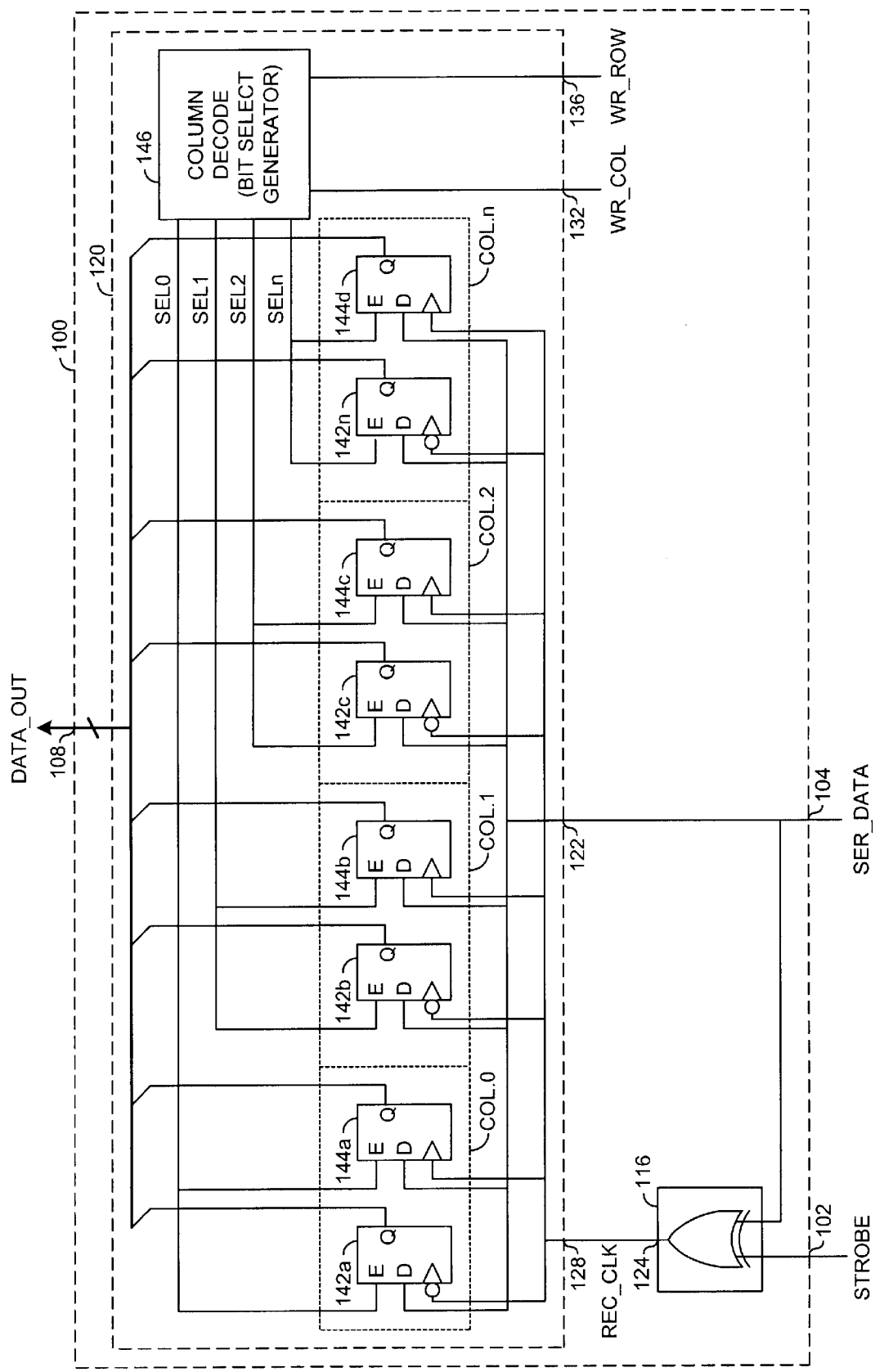
FIG. 4 is a more detailed block diagram of a preferred embodiment.

Referring to FIG. 2, a block diagram of a circuit 100 is shown in accordance with a preferred embodiment of the present invention. The circuit 100 may be implemented, in one example, as a high-speed serial data to parallel data converter circuit. The circuit 100 may have an input 102 that may receive a strobe signal (e.g., STROBE), an input 104 that may receive a serial data signal (e.g., SER_DATA), an input 106 that may receive a clock signal (e.g., LCL_CLK), and an output 108 that may present a parallel data signal (e.g., DATA_OUT). The signals SER_DATA and STROBE may be presented to the circuit 100 by a remote system 110. The signals SER_DATA and STROBE may comprise, in one example, a two-bit data/strobe symbol, where one of the two signals (data or strobe) generally toggles at each frequency interval of a serial data clock of the remote system 110. The signal DATA_OUT may be presented to an input 112 of a local system 114. The local system 114 may present the signal LCL_CLK to the circuit 100. The signal LCL_CLK may be used to control a presentation rate of the signal DATA_OUT.

Referring to FIG. 3, a detailed block diagram of the circuit 100 is shown. The circuit 100 may comprise a circuit 116, a circuit 118, and a circuit 120. The circuit 116 may be implemented, in one example, as a clock recovery circuit. The circuit 118 may be implemented, in one example, as an address logic circuit. The circuit 120 may be implemented, in one example, as a FIFO memory array. The signal STROBE may be presented to a first input of the circuit 116. The signal SER_DATA may be presented to a second input of the circuit 116 and an input 122 of the circuit 120. The circuit 116 may have an output 124 that may present a signal (e.g., REC_CLK) to (i) an input 126 of the circuit 118 and (ii) an input 128 of the circuit 120. The circuit 116 may be configured to generate the signal REC_CLK in response to the signals SER_DATA and STROBE. The signal REC_CLK may be a recovered data clock of the signal SER_DATA.

The signal LCL_CLK may be presented to an input of the circuit 118. The circuit 118 may have an output 130 that may present a signal (e.g., WR_COL) to an input 132 of the circuit 120, an output 134 that may present a signal (e.g., WR_ROW) to an input 136 of the circuit 120, and an output 138 the may present a signal (e.g., RD_ROW) to an input 140 of the circuit 120. The signals WR_COL, WR_ROW, and RD_ROW may be N-bits wide where N is an integer. The signals WR_COL, WR_ROW, and RD_ROW may be used, in one example, as address signals. The circuit 118 may be configured to generate the signals WR_COL, WR_ROW, and RD_ROW in response to the signal REC_CLK and/or the signal LCL_CLK.

The circuit 120 may have an output that may present the signal DATA_OUT. The circuit 120 may be configured to generate the signal DATA_OUT in response to the signals SER_DATA, REC_CLK, WR_COL, WR_ROW, and RD_ROW. The circuit 120 may be divided into a first clock domain and a second clock domain. The first clock domain generally runs at a first frequency that may be set by the signal REC_CLK. The second clock domain generally runs at a second frequency that may be the same as a frequency of the signal LCL_CLK. The portions of the circuit 120 associated with each clock domain may be adjusted to compensate for a difference between the frequency of the first domain and the frequency of the second domain.

Referring to FIG. 4, a detailed block diagram illustrating an implementation of the circuits 116 and 120 is shown. The circuit 116 may be implemented, in one example, as an exclusive-OR gate. The circuit 120 may comprise a FIFO memory. The FIFO memory may be implemented in many different ways. In one example, an array of negative and positive edge triggered storage elements (e.g., flip-flops) may be used. The storage elements may be implemented, in one example, as D-type flip-flops with a clock enable input. However, other types of memory elements may be implemented accordingly to meet the design criteria of a particular application.

The circuit 120 may be organized into a number of rows. For clarity, only one row is illustrated in FIG. 4. Each row of the circuit 120 may comprise one or more negative-edge triggered flip-flops 142a–142n, one or more positive-edge triggered flip-flops 144a–144n, and a column decode circuit 146. The flip-flops 142a–142n and 144a–144n are generally arranged in pairs that comprise a negative-edge triggered flip-flop and a positive-edge triggered flip-flop (e.g., 142a and 144a, 142b and 144b, etc.). A column select signal (e.g., SEL0–SELn) is generally presented to an enable input of each of the flip-flops in a pair (e.g., the signal SEL0 may be presented to the enable inputs of the flip-flops 142a and 144a, the signal SELn may be presented to the enable inputs of the flip-flops 142n and 144n, etc.).

The signal REC_CLK may be presented to a clock input of each of the flip-flops 142a–142n and 144a–144n. The signal SER_DATA may be presented to a D-input of each of the flip-flops 142a–142n and 144a–144n. A Q-output of the flip-flops 142a–142n and 144a–144n may present one bit of the parallel data signal DATA_OUT. The circuit 146 may be configured to generate the signals SEL0–SELn in response to the signals WR_COL and WR_ROW.

Figure 5:
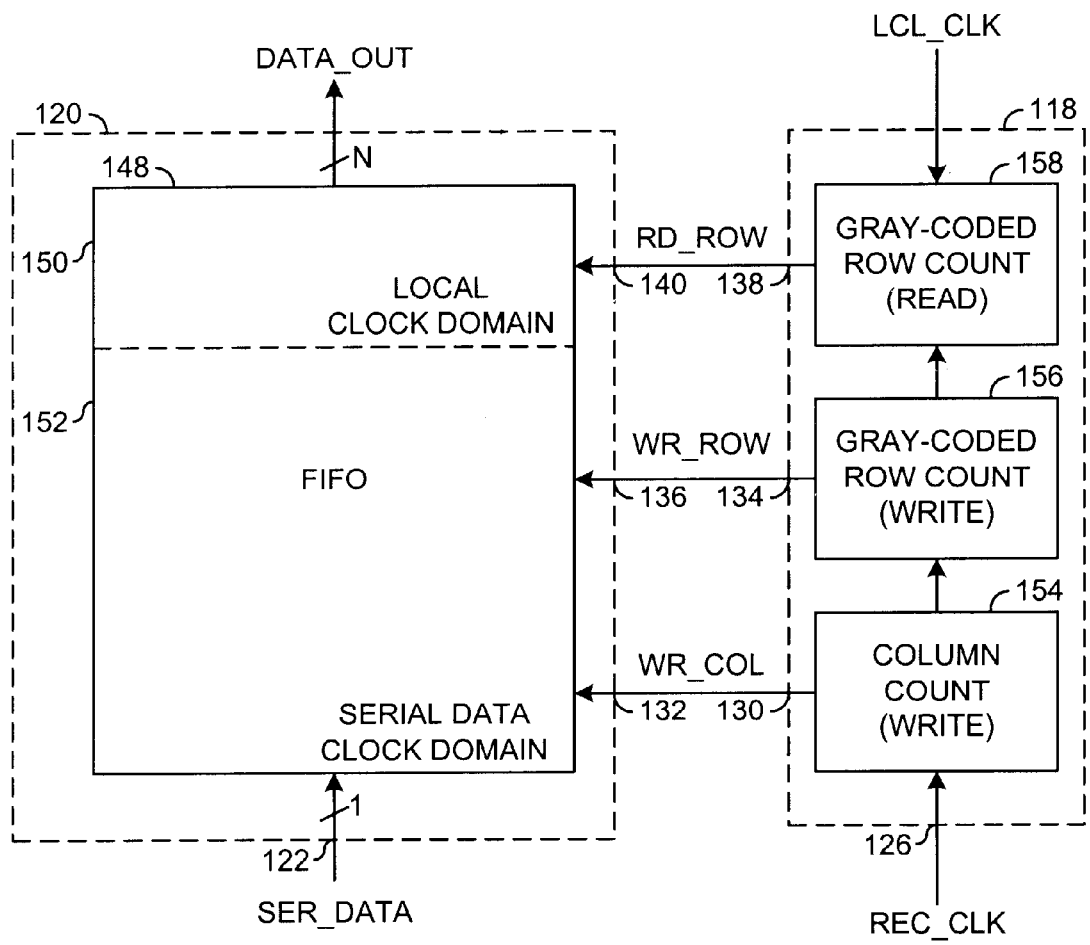
FIG. 5 is a block diagram illustrating a FIFO structure of a preferred embodiment.

Referring to FIG. 5, a block diagram illustrating an example FIFO structure of the circuit 120. The circuit 120 may comprise a FIFO buffer 148 that may be divided into a local clock domain and a serial data clock domain 152. A data bit contained in the signal SER_DATA may enter the FIFO 148 at a location determined by the pointers WR_COL and WR_ROW. The signal WR_ROW generally points to a row in the serial data clock domain 152 and the signal WR_COL generally points to a column in the particular row for storing the data bit. The signal WR_ROW may be a gray coded row count.

A row of data may be presented as the signal DATA_OUT in response to the signal RD_ROW. The signal RD_ROW may be a gray coded row count. The row of data presented in the signal DATA_OUT is generally taken from the local clock domain 150.

The circuit 118 may comprise a counter 154, a counter 156, and a counter 158. The counter 154 may be implemented as a column counter. The counter 154 may be incremented with each positive transition of the signal REC_CLK. When the counter 154 has reached a predetermined word width, the counter 154 may be configured to present a signal to increment the counter 156. The counter 156 may be a gray coded counter. The counter 156 may be configured to pass a gray coded row count to the counter 158. The counter 158 may be implemented, in one example, as a gray coded counter. The counter 158 may be configured to increment a row pointer in the local clock domain in response to the signal LCL_CLK.

Figure 6:
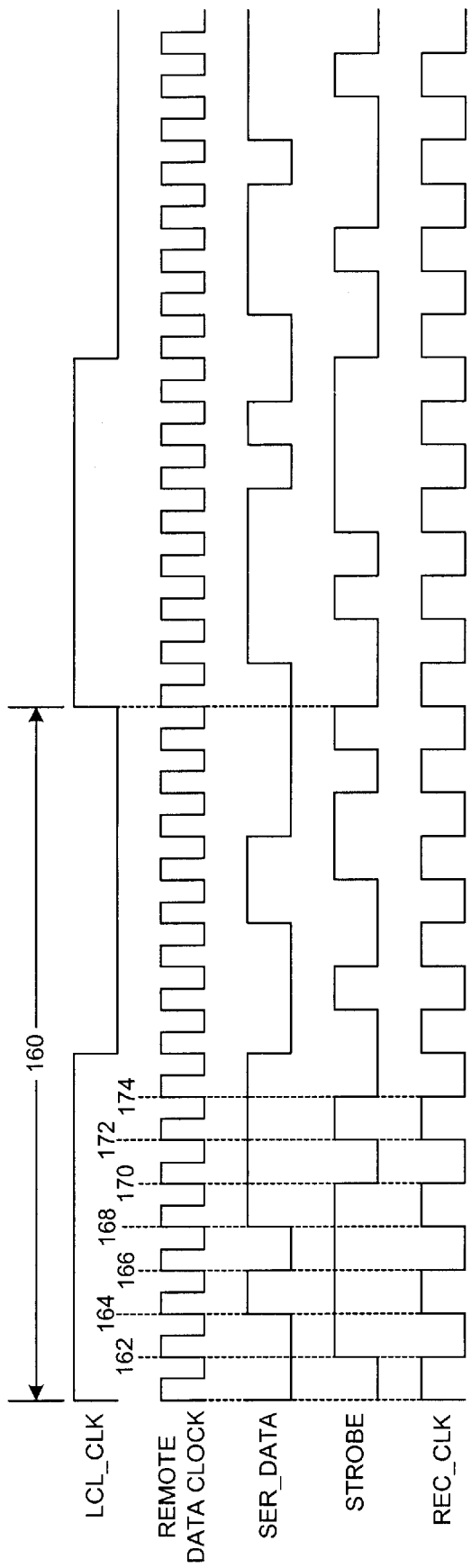
FIG. 6 is a timing diagram illustrating an example operation of the present invention.

Referring to FIG. 6, a timing diagram illustrating various waveforms of an example operation of the circuit 100. The signal LCL_CLK generally runs at a lower frequency than a remote data clock (e.g., portion 160). The recovered data clock signal REC_CLK generally has a frequency that is half the frequency of the remote data clock (e.g., portion 160). The signal REC_CLK generally has a single transition for each data bit and a positive transition once every two data bits (e.g., sample points 162–174). The incoming serial data may be encoded, in one example, into the signals SER_DATA and STROBE where one of the two signals SER_DATA and STROBE generally toggles at each remote data clock interval (e.g., sample points 162–174).

The present invention may provide a simple method for converting serial data (e.g., IEEE 1394) into parallel data while maintaining correct word organization. The size of a word may be, in one example, 2, 4 or 8 bits. Regardless of the size, a word is generally stored in the same storage device. The signal SER_DATA may be presented at a high frequency (e.g., 100 MHz, 200 MHz, 400 MHz, etc.). The signal REC_CLK will generally have a frequency that is half the frequency of the signal SER_DATA. In one example, the IEEE 1394 standard defines 100 to be 98.304 MHz. When the signal SER_DATA is an IEEE 1394 standard signal, the signal REC_CLK may have a respective frequency of about 49.152 MHz, 98.304 MHz, 196.608 MHZ, etc. The signal DATA_OUT may be presented at a frequency (e.g., 50MHz) that is lower than the frequency of the signal SER_DATA. Although the frequency of the serial data stream SER_DATA may be guaranteed to be within certain limits, the signal SER_DATA is generally not synchronized to the local system. The local clock generally runs at a substantially constant frequency (e.g., 50 MHz).

The present invention generally uses a rising and/or a falling edge of the recovered incoming data clock REC_CLK to store data in an array of flip-flops. The data may be written one bit at a time. A counter may be used to generate an enable signal for each pair of flip-flops. The pair of flip-flops generally comprises one rising-edge flip-flop and one falling-edge flip-flop. Once a word is complete, a row counter is generally incremented to the next location.

The recovered incoming data clock REC_CLK is generally used to clock data into the array of flip-flops. On the falling edge of the incoming data clock, data is generally clocked into the first flip-flop. The next bit of data is generally clocked into the second flip-flop on the rising edge of the incoming data clock. Also on the rising edge of the incoming data clock, the column counter is generally incremented to select a next pair of flip-flops. A binary equivalent of a gray-coded counter value may be used. A gray coded counter value may used to maintain the proper bit order. The arrangement of flip-flops may be such that the "width" of the array is generally equal to the maximum number of bits in a local word. In one example, the maximum number of bits may be 8. When the column counter reaches a maximum value (e.g., 1, 2, or 4), a row counter may be incremented. The circuit 120 may be configured to have a depth that is generally sufficient to buffer the incoming data such that underflow and overflow generally will not occur when matching the incoming clock rate to the local clock rate.

Each row of the circuit 120 generally contains a single word. For example, when a word is 4 bits wide and the FIFO array is 8 bits wide, 4 bits per row will generally be unused. Alternatively, the contents of a row may be tailored for certain peripherals. For example, a tag may be added to a row when the row is filled.

A write select signal (e.g., WR_ROW) may be generated for each row of the circuit 120 in the serial data clock domain. A gray-code counter may be used to generate the write select signal WR_ROW. The circuit 120 may be accessed directly using the gray code (as opposed to converting the gray code to a binary value). The gray code write pointer may be passed to the local clock domain FIFO control logic.

A read select signal (e.g., RD_ROW) may be generated by a read row counter for each row of the circuit 120 located in the local clock domain. The read row counter may also be gray coded. The gray code value of the read pointer RD_ROW may be used directly to access the circuit 120.

The signal SER_DATA may contain dribble bit sequences. The dribble bit sequences may be shorter than the word length for any given data size. The shorter length generally makes an incomplete row. The column counter for an incomplete row will generally not reach a maximum value. The FIFO gray code pointer is generally not incremented until the column counter reaches the maximum value. Since the gray code pointer is not incremented for an incomplete row, the dribble bits may be automatically ignored and/or discarded. The FIFO pointers may be decoded in different ways to take advantage of automatically discarding dribble bits. The present invention may strip the dribble bits from the data or leave them as part of the data. Since dribble bits may be repeated to other devices on the bus, but generally must not be forwarded to a link layer, both behaviors may be desirable.

The present invention may maintain the order of the incoming data without the need to re-align incomplete words externally to a FIFO storage device. In addition, by using gray codes directly to access the FIFO and transfer pointer information across clock domains, one level of synchronization logic may be eliminated. By using only the recovered incoming data clock to clock the incoming data, the present invention may guarantee that the data is always valid when clocked into the FIFO.

The present invention may provide a number of new features. For example: using a gray-coded version of a count to address the fifo storage, loading the serial data into the FIFO bit-by-bit as opposed to using a shift register to complete the serial-to-parallel conversion prior to storing, using the storage device to correctly align and selectively strip odd-sized dribble bit sequences, and/or alternating negative and positive edge triggered flip-flops in the construction of a FIFO array. Also, the data interface of this invention may run exclusively on the recovered data clock, even though the recovered clock may stop, without requiring an external high-speed clock source.

The present invention may simplify the logic required to pass the FIFO pointers across clock domains. Passing FIFO pointers across clock domains may be necessary to control access to the circuit 120. Reducing the logic required to pass pointers may allow the circuit 100 to operate at higher speeds where the clock period is generally too short for complex logic functions in one cycle. The present invention may guarantee that the serial data is written to the circuit 120 in the correct order without the need for re-alignment by logic on the local (parallel) side. The circuit 100 may be synthesizable and use synchronous design techniques. A higher speed logic portion may follow the same flow as the rest of the logic minimizing errors and reducing time-to-market.

While the invention has been particularly shown and described with reference to the preferred embodiments thereof, it will be understood by those skilled in the art that various changes in form and details may be made without departing from the spirit and scope of the invention. For example, the present invention may be used anywhere a high frequency serial data stream is converted into parallel data in a different clock domain. Particularly, where the length of the serial data stream is not an integer multiple of the width of the FIFO storage device (and thus of the parallel data). Such a serial data stream generally occurs when extra dribble or end of sequence non-data bits are used. The present invention may be applicable to a USB 2.0 elasticity buffer.

What is claimed is:

1. An apparatus comprising:
   an array of storage elements configured to (i) store a first bit of data in response to a write address and a first edge of a first clock signal, (ii) store a second bit of data in response to said write address and a second edge of said first clock signal, and (iii) present one or more of said first and second bits in response to a read address, said first and second edges of said first clock having opposite polarities;
   a first circuit configured to generate said first clock signal in response to a serial data stream and a strobe signal; and
   a second circuit configured to generate said write address and said read address in response to said first clock signal and a second clock signal.

2. The apparatus according to claim 1, wherein said first edge is a negative edge and said second edge is a positive edge.

3. The apparatus according to claim 1, wherein said storage elements comprise flip-flops.

4. The apparatus according to claim 1, wherein said storage elements comprise D-type flip-flops.

5. The apparatus according to claim 1, wherein said first circuit comprises a clock recovery circuit.

6. The apparatus according to claim 1, wherein said first circuit comprises a logic gate.

7. The apparatus according to claim 6, wherein said logic gate comprises an exclusive-OR gate.

8. The apparatus according to claim 1, wherein said second circuit comprises a first counter.

9. The apparatus according to claim 8, wherein said first counter comprises a gray-code counter.

10. The apparatus according to claim 8, wherein said second circuit comprises a second counter.

11. The apparatus according to claim 10, wherein said second counter comprises a gray-code counter.

12. The apparatus according to claim 1, wherein a width of said array of storage elements comprises a number of bits selected from the group consisting of 2, 4, and 8.

13. The apparatus according to claim 12, wherein said number of bits is selected in response to a control signal.

14. The apparatus according to claim 1, wherein said second clock signal has a constant frequency.

15. The apparatus according to claim 14, wherein said constant frequency is 50 MHz.

16. The apparatus according to claim 1, wherein said first clock signal has a maximum frequency selected from the group consisting of 50 MHz, 100 MHz, and 200 MHz.

17. The apparatus according to claim 1, wherein said apparatus comprises a FIFO memory configured to convert said serial data stream to parallel data in response to a recovered data encoded clock.

18. A method for using a recovered data encoded clock to convert high-frequency serial data to lower frequency parallel data comprising the steps of:

(A) storing a first bit of data in response to a write address and a first edge of a first clock signal;

(B) storing a second bit of data in response to said write address and a second edge of said first clock signal, said first and second edges have opposite polarities;

(C) presenting one or more of said first and second bits in response to a read address;

(D) generating said first clock signal in response to a serial data stream and a strobe signal; and (E) generating said write address and said read address in response to said first clock signal and a second clock signal.

19. The method according to claim 18, wherein said first edge is a negative edge and said second edge is a positive edge.

20. An apparatus comprising:

means for (i) storing a first bit of data in response to a write address and a first edge of a first clock signal, (ii) storing a second bit of data in response to said write address and a second edge of said first clock signal, and (iii) presenting one or more of said first and second bits in response to a read address, said first and second edges of said first clock signal having opposite polarities;

means for generating said first clock signal in response to a serial data stream and a strobe signal; and means for generating said write address and said read address in response to said first clock signal and a second clock signal.

* * * * *